(12) United States Patent
Li (10) Patent No.: US 9,520,421 B1
(45) Date of Patent: Dec. 13, 2016

(54) METHOD FOR MANUFACTURING LTPS TFT SUBSTRATE AND LTPS TFT SUBSTRATE

(71) Applicant: Shenzhen China Star Optoelectronics Technology Co., Ltd., Shenzhen (CN)

(72) Inventor: Songshan Li, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 0 days.

(21) Appl. No.: 14/771,502

(22) PCT Filed: Jun. 29, 2015

(86) PCT No.: PCT/CN2015/082667
§ 371 (c)(1),
(2) Date: Aug. 31, 2015

(51) Int. Cl.
*H01L 27/12* (2006.01)
*H01L 21/02* (2006.01)
*H01L 29/66* (2006.01)
*H01L 21/265* (2006.01)

(52) U.S. Cl.
CPC ..... *H01L 27/1281* (2013.01); *H01L 21/02488* (2013.01); *H01L 21/02502* (2013.01); *H01L 21/02532* (2013.01); *H01L 21/02592* (2013.01); *H01L 21/02672* (2013.01); *H01L 21/26513* (2013.01); *H01L 27/1262* (2013.01); *H01L 29/66757* (2013.01)

(58) Field of Classification Search
CPC combination set(s) only.
See application file for complete search history.

(56) References Cited

U.S. PATENT DOCUMENTS

| | | | |
|---|---|---|---|
| 2005/0224799 A1* | 10/2005 | Yamamoto | H01L 29/66757 257/66 |
| 2006/0160281 A1* | 7/2006 | Huang | H01L 29/66757 438/149 |
| 2007/0072348 A1* | 3/2007 | Chen | H01L 27/1248 438/149 |

(Continued)

*Primary Examiner* — Mamadou Diallo
(74) *Attorney, Agent, or Firm* — Leong C. Lei (57) ABSTRACT

The present invention provides a method for manufacturing a LTPS TFT substrate and a LTPS TFT substrate. The method for manufacturing the LTPS TFT substrate of the present invention forms a thermally conductive electrical insulation layer having excellent properties of electrical insulation and thermal conductivity on a buffer layer to quickly absorb a great amount of heat during a RTA process to be transferred to an amorphous silicon layer in contact therewith so that the portion of the amorphous silicon at this site shows an increased efficiency of crystallization, whereby polycrystalline silicon has an increased grain size and reduced gain boundaries and thus the mobility of charge carriers of a corresponding TFT device is increased and the influence of the leakage current caused by grain boundary is reduced. The LTPS TFT substrate of the present invention includes a thermally conductive electrical insulation layer formed on a buffer layer at a location exactly under a polycrystalline silicon semiconductor layer and the grain size of the crystallization of the polycrystalline silicon is relatively large, the grain boundaries are reduced in number, the mobility of charge carriers of a TFT device is increased, and the electrical property of the TFT is improved.

14 Claims, 7 Drawing Sheets

(56) References Cited

U.S. PATENT DOCUMENTS

| | | | |
|---|---|---|---|
| 2010/0047975 A1* | 2/2010 | Yeh | H01L 27/1214 438/166 |
| 2012/0153288 A1* | 6/2012 | Yuan | H01L 29/42384 257/59 |
| 2014/0138695 A1* | 5/2014 | Tian | H01L 29/66757 257/72 |
| 2015/0129854 A1* | 5/2015 | Byun | H01L 29/66757 257/40 |
| 2015/0214120 A1* | 7/2015 | Yang | H01L 21/77 438/154 |
| 2016/0141425 A1* | 5/2016 | Sun | H01L 27/124 257/72 |
| 2016/0163780 A1* | 6/2016 | Park | H01L 27/3248 257/40 |

* cited by examiner

METHOD FOR MANUFACTURING LTPS TFT SUBSTRATE AND LTPS TFT SUBSTRATE

BACKGROUND OF THE INVENTION

1. Field of the Invention

The present invention relates to the field of display technology, and in particular to a method for manufacturing a low-temperature polycrystalline silicon (LTPS) thin-film-transistor (TFT) substrate and a LTPS TFT substrate.

2. The Related Arts

The development of flat-panel displays brings successive demands for high-definition and low-power-consumption panels. Low-temperature polycrystalline silicon (LTPS), which has a relatively high mobility, has gained much attention from the industry of liquid crystal displays (LCDs) and organic light emitting diodes (OLEDs) and is considered an important material for achieving low-cost full-color flat-panel displays. For a flat-panel display, adopting a material of LTPS may possess various advantages including high definition, fast response speed, high brightness, high aperture rate, and low power consumption. In addition, LTPS can be used in manufacture in a low temperature and is applicable to the manufacture of C-MOS circuits, making it widely used to meet the needs of high definition and low power consumption for panels.

LTPS is a branch of the polycrystalline silicon (poly-Si) technology. The molecular structure of polycrystalline silicon shows an ordered and directional arrangement in a crystal grain. As such, the mobility thereof is faster than that of amorphous silicon (a-Si) that is generally randomly arranged by 200-300 times, making it possible to significantly increase the response speed of a flat-panel display. Various crystallization processes are available for manufacturing LTPS, among which primary ones are chemical vapor deposition (CVD), solid phase crystallization (SPC), metal-induced crystallization (MIC), metal-induced lateral crystallization (MILC), and excimer laser annealing (ELA).

Referring to FIGS. 1-6, a known method for manufacturing a LTPS TFT substrate generally comprises the following steps: Step 1: providing a substrate 100 and depositing a buffer layer 200 on the glass substrate 100; Step 2: depositing an amorphous silicon (a-Si) layer 300 on the buffer layer 200; Step 3: applying ion implantation to implant a predetermined dosage of boron into the amorphous silicon layer 300 and then applying rapid thermal anneal (RTA) to heat for 20-30 minutes to have the amorphous silicon crystallized into polycrystalline silicon (poly-Si), and then etching and removing an electrically conductive layer that precipitates on a surface of the polycrystalline silicon during the crystallization process and has a low electrical resistance with only a desired polycrystalline silicon layer 400 left; Step 4: patterning the polycrystalline silicon layer 400 through photolithographic and etching operations to form a polycrystalline silicon semiconductor layer 450; Step 5: coating photoresist on the polycrystalline silicon semiconductor layer 450 and conducting exposure and development on the photoresist to form a photoresist layer 550 on the polycrystalline silicon semiconductor layer 450 in such a way that two end portions of the polycrystalline silicon semiconductor layer 450 are exposed; implanting boron ions into the two end portions of the polycrystalline silicon semiconductor layer 450 through ion implantation with the photoresist layer 550 serving as a shielding layer so as to form source/drain contact zones 451; Step 6: peeling off the photoresist layer 550 and forming, in sequence, a gate insulation layer 500, a gate terminal 600, an interlayer insulation layer 700, and source/drain terminals 800 on the polycrystalline silicon semiconductor layer 450.

In the above-described method for manufacturing a LTPS TFT substrate, the formation of low-temperature polycrystalline silicon is achieved with a conventional SPC crystallization process. Such a SPC crystallization process, although forming grain sizes showing excellent consistency, the grain sizes are small and the grain boundaries are numerous, imposing influences on the mobility of charge carriers and the leakage current of a TFT device.

SUMMARY OF THE INVENTION

An object of the present invention is to provide a method for manufacturing a low-temperature polycrystalline silicon (LTPS) thin-film transistor (TFT) substrate, which effectively improves crystallization efficiency of a crystallization process, increases the grain sizes, reduces the number of grain boundaries, and thus improving the mobility of charge carriers of a TFT device, reducing the influence of the leakage current caused by the grain boundaries, and improving the electrical property of the TFT device.

Another object of the present invention is to provide a LTPS TFT substrate, of which the grain size of polycrystalline silicon is relatively large, the number of grain boundaries is reduced, the mobility of charge carriers of a TFT device is increased, and the electrical property of the TFT device is improved.

To achieve the above objects, the present invention provides a method for manufacturing a LTPS TFT substrate, which comprises the following steps:

(1) providing a substrate and depositing a buffer layer on the substrate;

(2) depositing a thermally conductive electrical insulation film on the buffer layer and patterning the thermally conductive electrical insulation film to form a thermally conductive electrical insulation layer;

(3) depositing an amorphous silicon layer on the buffer layer in such a way that the amorphous silicon layer completely covers the thermally conductive electrical insulation layer;

(4) implanting boron ions in the amorphous silicon layer through ion implantation; subjecting the amorphous silicon layer to rapid thermal annealing to have the amorphous silicon crystallized into polycrystalline silicon, and then applying an etching operation to remove an electrically conductive layer precipitating on a surface of the polycrystalline silicon during crystallization to form a polycrystalline silicon layer;

(5) patterning the polycrystalline silicon layer to form a polycrystalline silicon semiconductor layer;

(6) coating photoresist on the polycrystalline silicon semiconductor layer and conducting exposure and development on the photoresist to form a photoresist layer on the polycrystalline silicon semiconductor layer in such a way that two end portions of the polycrystalline silicon semiconductor layer are exposed; implanting boron ions into the two end portions of the polycrystalline silicon semiconductor layer through ion implantation with the photoresist layer serving as a shielding layer so as to form source/drain contact zones; and (7) peeling off the photoresist layer and forming, in sequence, a gate insulation layer, a gate terminal, an interlayer insulation layer, and source/drain terminals on the polycrystalline silicon semiconductor layer, wherein the source/drain terminals are respectively connected to the source/drain contact zones at the two end portions of the polycrystalline silicon semiconductor layer.

In step (1), the buffer layer is formed of a material of SiNx, SiOx, or a combination thereof.

In step (2), photolithographic and etching operations are applied to pattern the thermally conductive electrical insulation layer; the thermally conductive electrical insulation layer is formed of a material of $Al_2O_3$; and the thermally conductive electrical insulation layer has a thickness of 30-50 nm.

In step (3), the amorphous silicon layer has a thickness of 200-300 nm.

In step (4), the rapid thermal annealing is conducted at a temperature of 650° C.-700° C. for a time period of 15-25 minutes; and the electrically conductive layer that precipitates on the surface of the polycrystalline silicon is removed through etching by a thickness of 100-150 nm.

In step (5), photolithographic and etching operations are applied to pattern the polycrystalline silicon layer; and the pattern of the thermally conductive electrical insulation layer corresponds to the pattern of the polycrystalline silicon semiconductor layer.

In step (7), the gate insulation layer is formed of a material of SiOx.

The present invention also provides a method for manufacturing a LTPS TFT substrate, which comprises the following steps:

(1) providing a substrate and depositing a buffer layer on the substrate;

(2) depositing a thermally conductive electrical insulation film on the buffer layer and patterning the thermally conductive electrical insulation film to form a thermally conductive electrical insulation layer;

(3) depositing an amorphous silicon layer on the buffer layer in such a way that the amorphous silicon layer completely covers the thermally conductive electrical insulation layer;

(4) implanting boron ions in the amorphous silicon layer through ion implantation; subjecting the amorphous silicon layer to rapid thermal annealing to have the amorphous silicon crystallized into polycrystalline silicon, and then applying an etching operation to remove an electrically conductive layer precipitating on a surface of the polycrystalline silicon during crystallization to form a polycrystalline silicon layer;

(5) patterning the polycrystalline silicon layer to form a polycrystalline silicon semiconductor layer;

(6) coating photoresist on the polycrystalline silicon semiconductor layer and conducting exposure and development on the photoresist to form a photoresist layer on the polycrystalline silicon semiconductor layer in such a way that two end portions of the polycrystalline silicon semiconductor layer are exposed; implanting boron ions into the two end portions of the polycrystalline silicon semiconductor layer through ion implantation with the photoresist layer serving as a shielding layer so as to form source/drain contact zones; and (7) peeling off the photoresist layer and forming, in sequence, a gate insulation layer, a gate terminal, an interlayer insulation layer, and source/drain terminals on the polycrystalline silicon semiconductor layer, wherein the source/drain terminals are respectively connected to the source/drain contact zones at the two end portions of the polycrystalline silicon semiconductor layer;

wherein in step (1), the buffer layer is formed of a material of SiNx, SiOx, or a combination thereof;

wherein in step (2), photolithographic and etching operations are applied to pattern the thermally conductive electrical insulation layer; the thermally conductive electrical insulation layer is formed of a material of $Al_2O_3$; and the thermally conductive electrical insulation layer has a thickness of 30-50 nm;

wherein in step (3), the amorphous silicon layer has a thickness of 200-300 nm.

The present invention further provides a LTPS TFT substrate, which comprises a substrate, a buffer layer arranged on the substrate, a thermally conductive electrical insulation layer arranged on the buffer layer, a polycrystalline silicon semiconductor layer arranged on the thermally conductive electrical insulation layer, a gate insulation layer arranged on the buffer layer and covering the thermally conductive electrical insulation layer and the polycrystalline silicon semiconductor layer, a gate terminal arranged on the gate insulation layer, an interlayer insulation layer arranged on the gate insulation layer and covering the gate terminal, and source/drain terminals arranged on the interlayer insulation layer;

wherein the polycrystalline silicon semiconductor layer has two opposite end portions that are source/drain contact zones implanted with boron ions; the gate insulation layer and the interlayer insulation layer both have portions corresponding to the source/drain contact zones and formed with vias; and the source/drain terminals are respectively connected through the vias to the source/drain contact zones.

The buffer layer is formed of a material of SiNx, SiOx, or a combination thereof; the thermally conductive electrical insulation layer is formed of a material of $Al_2O_3$; and the gate insulation layer is formed of a material of SiOx.

The thermally conductive electrical insulation layer has a thickness of 30-50 nm; the thermally conductive electrical insulation layer has a pattern corresponding to a pattern of the polycrystalline silicon semiconductor layer.

The efficacy of the present invention is that the present invention provides a method for manufacturing a LTPS TFT substrate, in which a thermally conductive electrical insulation layer having excellent properties of electrical insulation and thermal conductivity is formed on the buffer layer to quickly absorb a great amount of heat during a RTA process to be transferred to an amorphous silicon layer in contact therewith so that the portion of the amorphous silicon at this site shows an increased efficiency of crystallization, whereby polycrystalline silicon has an increased grain size and reduced gain boundaries and thus the mobility of charge carriers of a corresponding TFT device is increased and the influence of the leakage current caused by grain boundary is reduced. The present invention also provides an LTPS TFT substrate, in which a thermally conductive electrical insulation layer is formed on a buffer layer at a location exactly under the polycrystalline silicon semiconductor layer and the grain size of the crystallization of the polycrystalline silicon is relatively large, the grain boundaries are reduced in number, the mobility of charge carriers of a TFT device is increased, and the electrical property of the TFT is improved.

BRIEF DESCRIPTION OF THE DRAWINGS

The features and technical contents of the present invention will be apparent from the following detailed description of the present invention and the attached drawing; however, these drawings are provided for reference and illustration and are not intended to limit the scope of the present invention. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
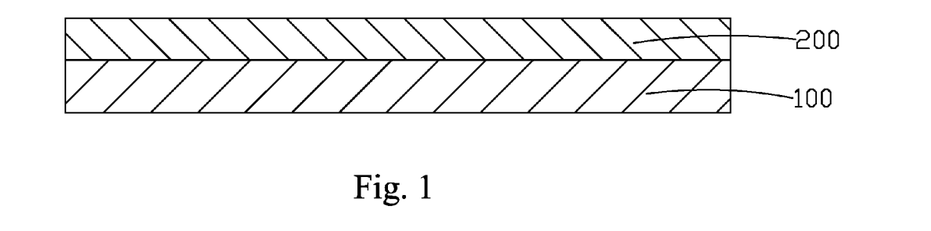
FIG. 1 is a schematic view illustrating a first step of a known method for manufacturing a low-temperature polycrystalline silicon (LTPS) thin-film transistor (TFT) substrate.
Figure 2:
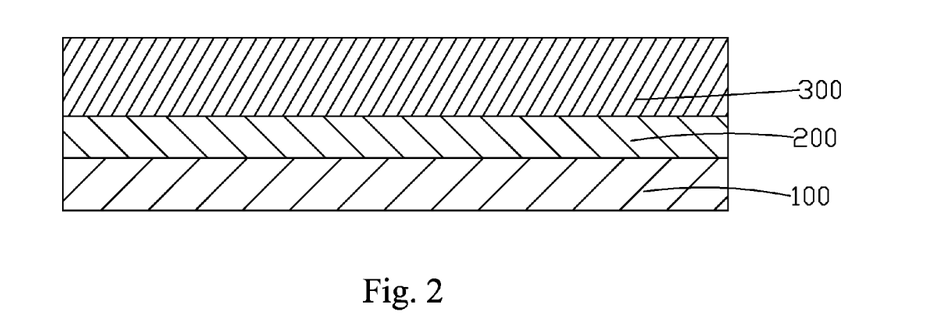
FIG. 2 is a schematic view illustrating a second step of the known method for manufacturing the LTPS TFT substrate.
Figure 3:
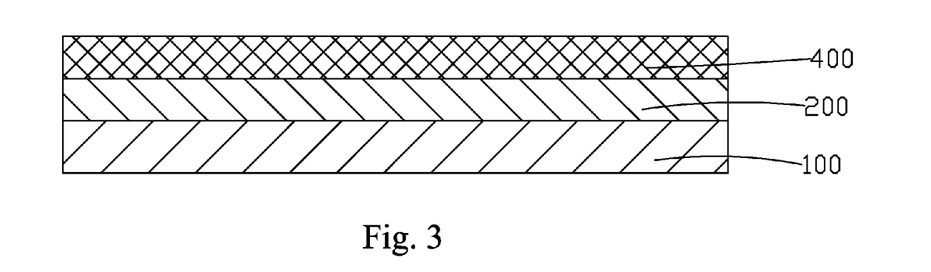
FIG. 3 is a schematic view illustrating a third step of the known method for manufacturing the LTPS TFT substrate.
Figure 4:
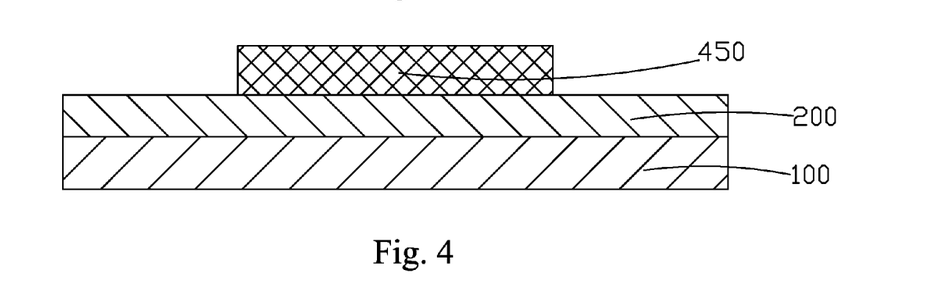
FIG. 4 is a schematic view illustrating a fourth step of the known method for manufacturing the LTPS TFT substrate.
Figure 5:
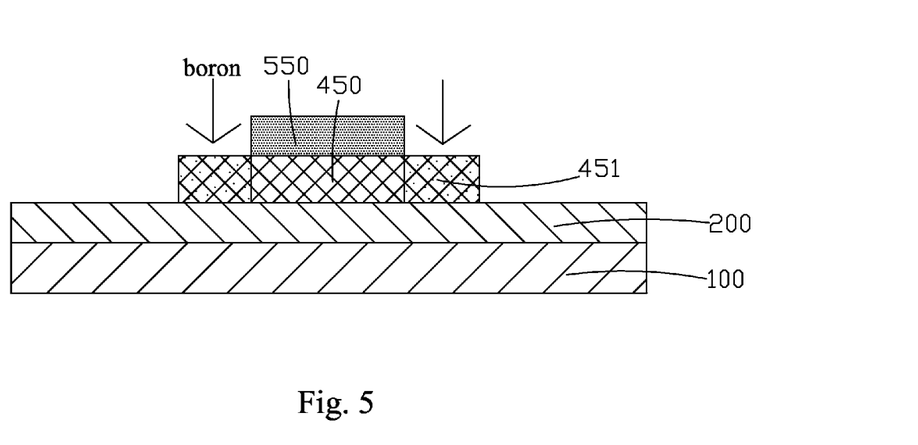
FIG. 5 is a schematic view illustrating a fifth step of the known method for manufacturing the LTPS TFT substrate.
Figure 6:
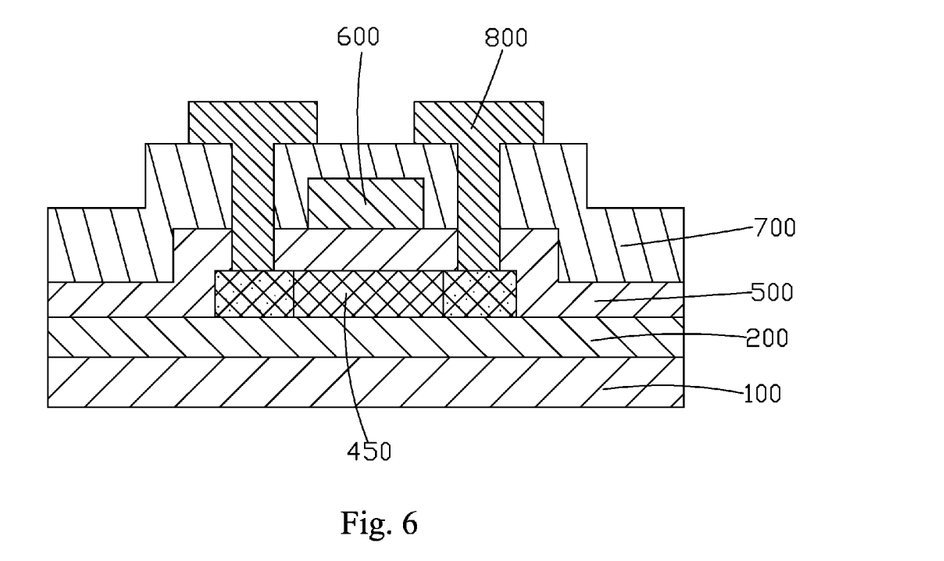
FIG. 6 is a schematic view illustrating a sixth step of the known method for manufacturing the LTPS TFT substrate.
Figure 7:
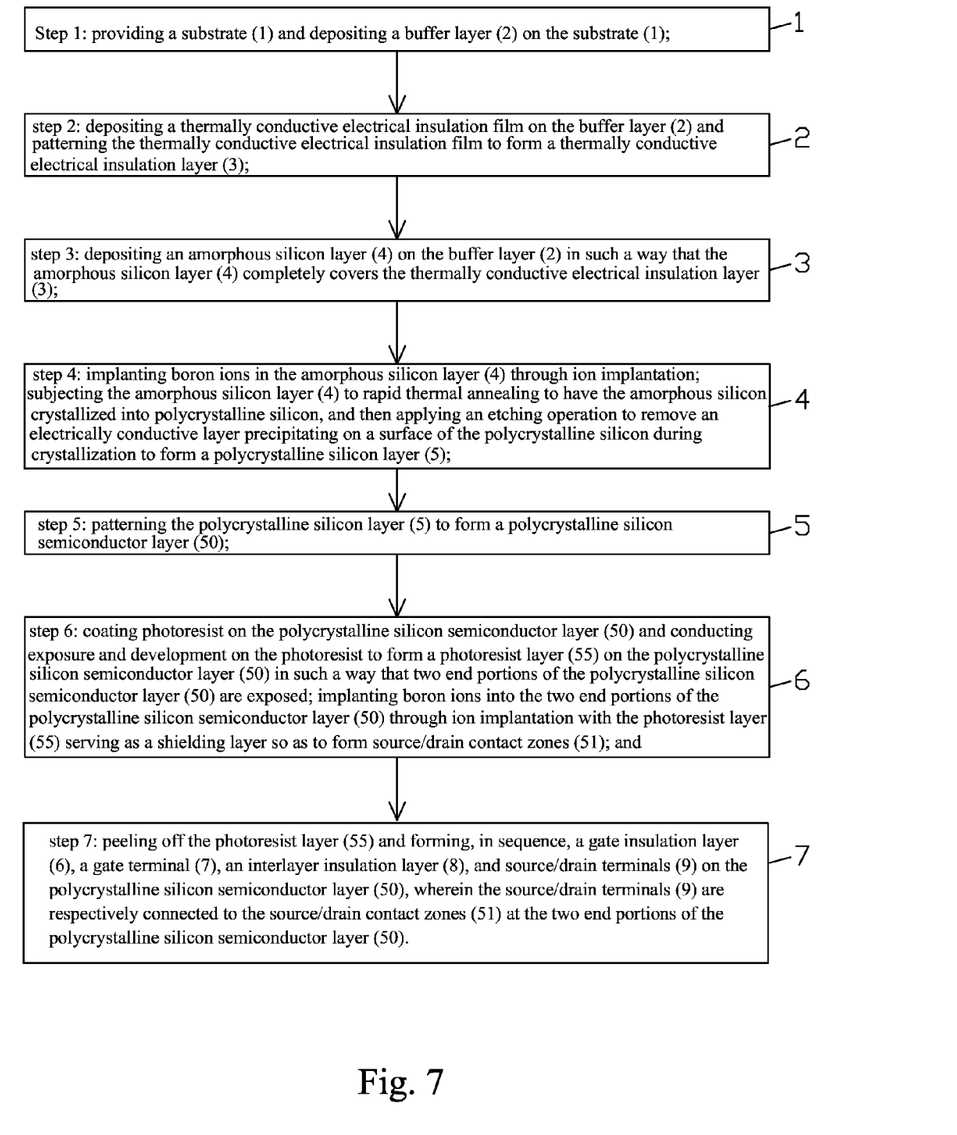
FIG. 7 is a flow chart illustrating a method for manufacturing a LTPS TFT substrate according to the present invention.
Figure 8:
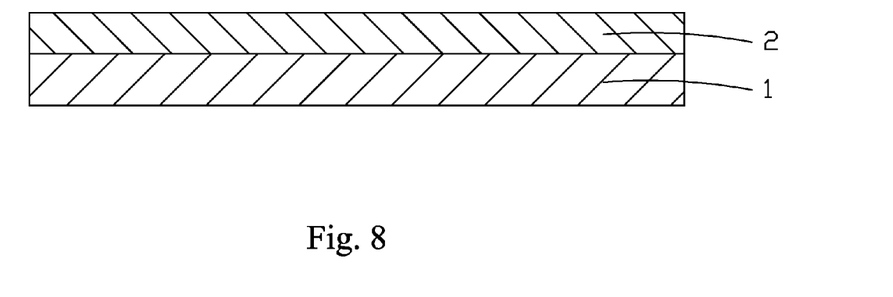
FIG. 8 is a schematic view illustrating a first step of the method for manufacturing the LTPS TFT substrate according to the present invention.

Referring to FIGS. 7-15, firstly, the present invention provides a method for manufacturing a low-temperature polycrystalline (LTPS) thin-film transistor (TFT) substrate, which comprises the following steps:

Step 1: as shown in FIG. 8, providing a substrate 1 and depositing a buffer layer 2 on the substrate 1.

The substrate 1 can be a regular transparent substrate and, preferably, the substrate 1 is a glass substrate.

Specifically, the buffer layer 2 is formed of a material of SiNx, SiOx, or a combination thereof.

Figure 9:
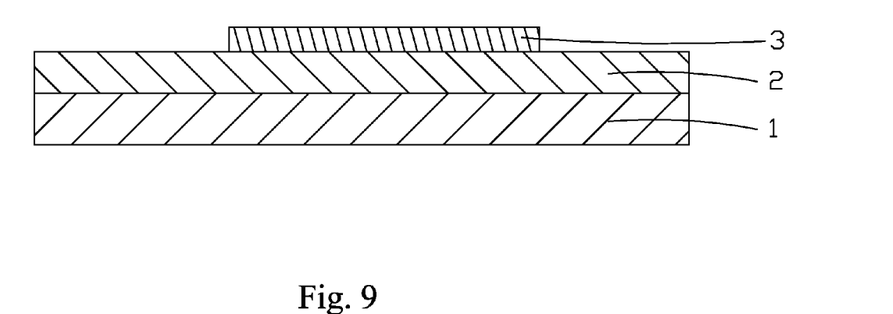
FIG. 9 is a schematic view illustrating a second step of the method for manufacturing the LTPS TFT substrate according to the present invention.

Step 2: as shown in FIG. 9, depositing a thermally conductive electrical insulation film on the buffer layer 2 and patterning the thermally conductive electrical insulation film to form a thermally conductive electrical insulation layer 3.

Specifically, the thermally conductive electrical insulation layer 3 is formed of a material of $Al_2O_3$.

Preferably, the thermally conductive electrical insulation layer 3 has a thickness of 30-50 nm.

Specifically, photolithographic and etching operations are applied to pattern the thermally conductive electrical insulation layer 3 in such a way that the thermally conductive electrical insulation layer 3 has a size that corresponds to a size of a polycrystalline silicon semiconductor layer 5 to be formed later.

Figure 10:
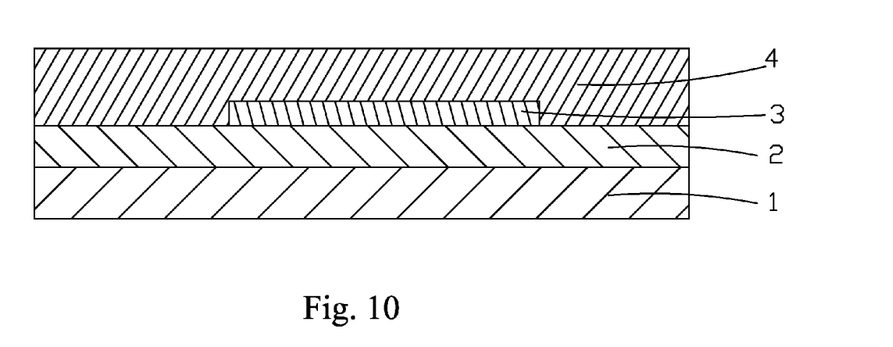
FIG. 10 is a schematic view illustrating a third step of the method for manufacturing the LTPS TFT substrate according to the present invention.

Step 3: as shown in FIG. 10, depositing an amorphous silicon layer 4 on the buffer layer 2 in such a way that the amorphous silicon layer 4 completely covers the thermally conductive electrical insulation layer 3.

Preferably, the amorphous silicon layer 4 has a thickness of 200-300 nm.

Figure 11:
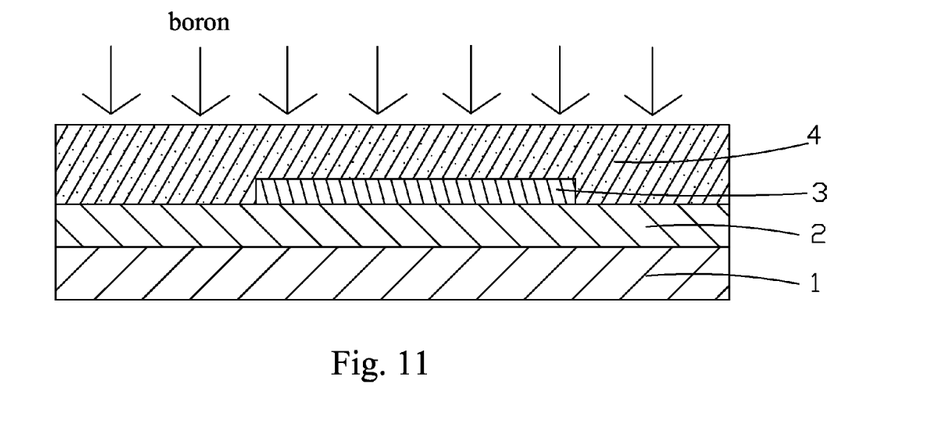
FIG. 11 is a schematic view illustrating implanting a predetermined amount of boron in an amorphous silicon layer in a fourth step of the method for manufacturing the LTPS TFT substrate according to the present invention.
Figure 12:
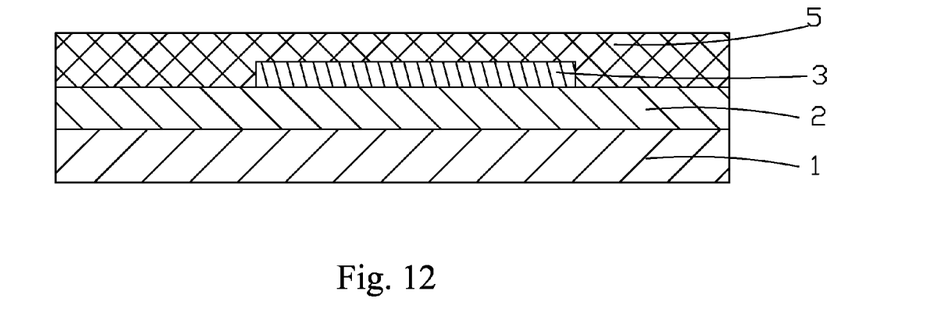
FIG. 12 is a schematic view illustrating the structure after the fourth step of the method for manufacturing the LTPS TFT substrate according to the present invention.

Step 4: as shown in FIGS. 11 and 12, implanting a predetermined amount of boron ions in the amorphous silicon layer 4 through ion implantation; subjecting the amorphous silicon layer 4 to rapid thermal annealing (RTA) to have the amorphous silicon crystallized into polycrystalline silicon, and then applying an etching operation to remove an electrically conductive layer precipitating on a surface of the polycrystalline silicon during crystallization to form a polycrystalline silicon layer 5.

Specifically, the RTA is conducted at a temperature of 650° C.-700° C. for a time period of 15-25 minutes.

Preferably, the electrically conductive layer that precipitates on the surface of the polycrystalline silicon is removed through etching by a thickness of 100-150 nm in order to completely remove the electrically conductive layer with only the structure of the polycrystalline silicon left.

Figure 13:
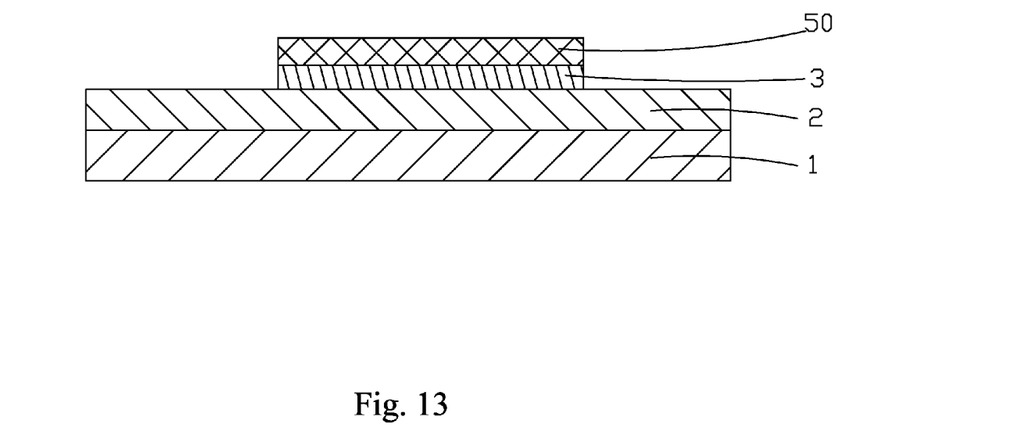
FIG. 13 is a schematic view illustrating a fifth step of the method for manufacturing the LTPS TFT substrate according to the present invention.

Step 5: as shown in FIG. 13, patterning the polycrystalline silicon layer 5 through photolithographic and etching operations to form a polycrystalline silicon semiconductor layer 50.

Specifically, the pattern of the polycrystalline silicon semiconductor layer 50 corresponds to the pattern of the thermally conductive electrical insulation layer 3.

Figure 14:
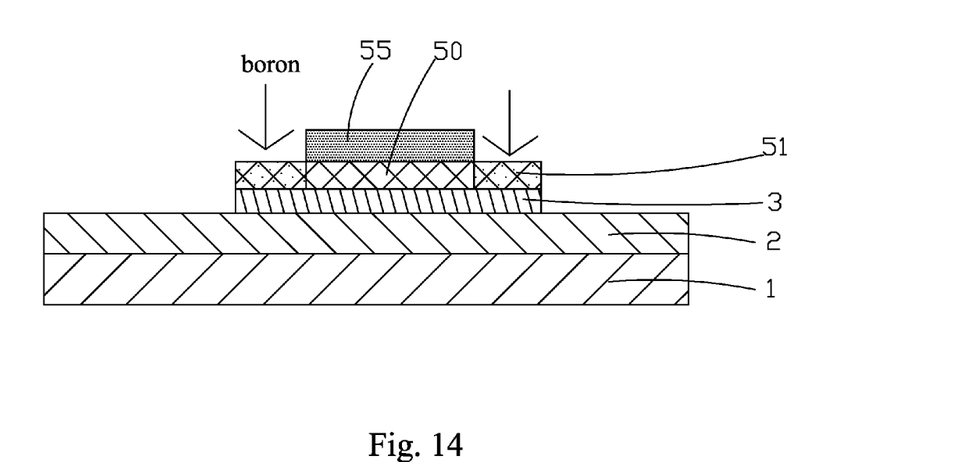
FIG. 14 is a schematic view illustrating a sixth step of the method for manufacturing the LTPS TFT substrate according to the present invention.

Step 6: as shown in FIG. 14, coating photoresist on the polycrystalline silicon semiconductor layer 50 and conducting exposure and development on the photoresist to form a photoresist layer 55 on the polycrystalline silicon semiconductor layer 50 in such a way that two end portions of the polycrystalline silicon semiconductor layer 50 are exposed; implanting boron ions into the two end portions of the polycrystalline silicon semiconductor layer 50 through ion implantation with the photoresist layer 55 serving as a shielding layer so as to form source/drain contact zones 51.

Figure 15:
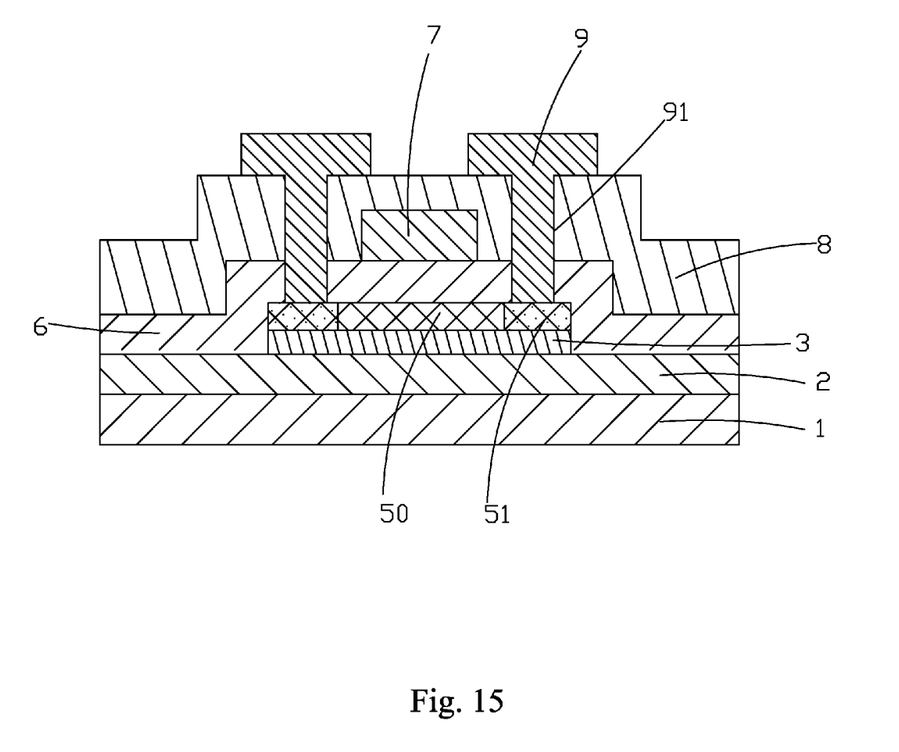
FIG. 15 is a schematic view illustrating a seventh step of the method for manufacturing the LTPS TFT substrate structure according to the present invention and is also a schematic cross-sectional view of the LTPS TFT substrate according to the present invention.

Step 7: as shown in FIG. 15, peeling off the photoresist layer 55 and forming, in sequence, a gate insulation layer 6, a gate terminal 7, an interlayer insulation layer 8, and source/drain terminals 9 on the polycrystalline silicon semiconductor layer 50, wherein the source/drain terminals 9 are respectively connected to the source/drain contact zones 51 at the two end portions of the polycrystalline silicon semiconductor layer 50.

To this point, the manufacturing of the LTPS TFT substrate is completed. Since the thermally conductive electrical insulation layer 3 provides excellent properties of electrical insulation and thermal conduction, during RTA, the thermally conductive electrical insulation layer 3 quickly absorbs a great amount of heat that is transferred to the amorphous silicon layer 4 in contact therewith so that the portion of the amorphous silicon at this site shows an increased efficiency of crystallization, whereby the grain size of polycrystalline silicon of the polycrystalline silicon layer 5 formed in Step 4 is increased and grain boundaries are reduced and thus the polycrystalline silicon semiconductor layer 50 formed in Step 5 possesses bettered electrical property, helping improve the mobility of charge carriers of a corresponding TFT device, reducing the influence of leakage current by the gain boundaries, and improving the electrical property of the TFT.

Referring to FIG. 15, the present invention also provides a LTPS TFT substrate, which comprises a substrate 1, a buffer layer 2 arranged on the substrate 1, a thermally conductive electrical insulation layer 3 arranged on the buffer layer 2, a polycrystalline silicon semiconductor layer 50 arranged on the thermally conductive electrical insulation layer 3, a gate insulation layer 6 arranged on the buffer layer 2 and covering the thermally conductive electrical insulation layer 3 and the polycrystalline silicon semiconductor layer 50, a gate terminal 7 arranged on the gate insulation layer 6, an interlayer insulation layer 8 arranged on the gate insulation layer 6 and covering the gate terminal 7, and source/drain terminals 9 arranged on the interlayer insulation layer 8.

The polycrystalline silicon semiconductor layer 50 has two opposite end portions that are source/drain contact zones 51 implanted with boron ions; the gate insulation layer 6 and the interlayer insulation layer 8 both have portions corresponding to the source/drain contact zones 51 and formed with vias 91; and the source/drain terminals 9 are respectively connected through the vias 91 to the source/drain contact zones 51.

Specifically, the buffer layer 2 is formed of a material of SiNx, SiOx, or a combination thereof.

Preferably, the thermally conductive electrical insulation layer 3 is formed of a material of $Al_2O_3$. Specifically, the gate insulation layer 6 is formed of a material of SiOx.

Preferably, the thermally conductive electrical insulation layer 3 has a thickness of 30-50 nm.

Specifically, the thermally conductive electrical insulation layer 3 has a pattern that corresponds to a pattern of the polycrystalline silicon semiconductor layer 50.

In the above-described LTPS TFT substrate, the buffer layer is provided thereon with the thermally conductive electrical insulation layer at a location exactly under the polycrystalline silicon semiconductor layer and the grain size of the crystallization of the polycrystalline silicon is relatively large, the grain boundaries are reduced in number, the mobility of charge carriers of a TFT device is increased, and the electrical property of the TFT is improved.

In summary, the present invention provides a method for manufacturing a LTPS TFT substrate, in which a thermally conductive electrical insulation layer having excellent properties of electrical insulation and thermal conductivity is formed on the buffer layer to quickly absorb a great amount of heat during a RTA process to be transferred to an amorphous silicon layer in contact therewith so that the portion of the amorphous silicon at this site shows an increased efficiency of crystallization, whereby polycrystalline silicon has an increased grain size and reduced gain boundaries and thus the mobility of charge carriers of a corresponding TFT device is increased and the influence of the leakage current caused by grain boundary is reduced. The present invention also provides an LTPS TFT substrate, in which a thermally conductive electrical insulation layer is formed on a buffer layer at a location exactly under the polycrystalline silicon semiconductor layer and the grain size of the crystallization of the polycrystalline silicon is relatively large, the grain boundaries are reduced in number, the mobility of charge carriers of a TFT device is increased, and the electrical property of the TFT is improved.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a low-temperature polycrystalline silicon (LTPS) thin-film transistor (TFT) substrate, comprising the following steps:
   (1) providing a substrate and depositing a buffer layer on the substrate;
   (2) depositing a thermally conductive electrical insulation film on the buffer layer and patterning the thermally conductive electrical insulation film to form a thermally conductive electrical insulation layer;
   (3) depositing an amorphous silicon layer on the buffer layer in such a way that the amorphous silicon layer completely covers the thermally conductive electrical insulation layer;
   (4) implanting boron ions in the amorphous silicon layer through ion implantation; subjecting the amorphous silicon layer to rapid thermal annealing to have the amorphous silicon crystallized into polycrystalline silicon, and then applying an etching operation to remove an electrically conductive layer precipitating on a surface of the polycrystalline silicon during crystallization to form a polycrystalline silicon layer;
   (5) patterning the polycrystalline silicon layer to form a polycrystalline silicon semiconductor layer;
   (6) coating photoresist on the polycrystalline silicon semiconductor layer and conducting exposure and development on the photoresist to form a photoresist layer on the polycrystalline silicon semiconductor layer in such a way that two end portions of the polycrystalline silicon semiconductor layer are exposed; implanting boron ions into the two end portions of the polycrystalline silicon semiconductor layer through ion implantation with the photoresist layer serving as a shielding layer so as to form source/drain contact zones; and
   (7) peeling off the photoresist layer and forming, in sequence, a gate insulation layer, a gate terminal, an interlayer insulation layer, and source/drain terminals on the polycrystalline silicon semiconductor layer, wherein the source/drain terminals are respectively connected to the source/drain contact zones at the two end portions of the polycrystalline silicon semiconductor layer.

2. The method for manufacturing the LTPS TFT substrate as claimed in claim 1, wherein in step (1), the buffer layer is formed of a material of SiNx, SiOx, or a combination thereof.

3. The method for manufacturing the LTPS TFT substrate as claimed in claim 1, wherein in step (2), photolithographic and etching operations are applied to pattern the thermally conductive electrical insulation layer; the thermally conductive electrical insulation layer is formed of a material of $Al_2O_3$; and the thermally conductive electrical insulation layer has a thickness of 30-50 nm.

4. The method for manufacturing the LTPS TFT substrate as claimed in claim 1, wherein in step (3), the amorphous silicon layer has a thickness of 200-300 nm.

5. The method for manufacturing the LTPS TFT substrate as claimed in claim 1, wherein in step (4), the rapid thermal annealing is conducted at a temperature of 650° C.-700° C.

for a time period of 15-25 minutes; and the electrically conductive layer that precipitates on the surface of the polycrystalline silicon is removed through etching by a thickness of 100-150 nm.

6. The method for manufacturing the LTPS TFT substrate as claimed in claim 1, wherein in step (5), photolithographic and etching operations are applied to pattern the polycrystalline silicon layer; and the pattern of the thermally conductive electrical insulation layer corresponds to the pattern of the polycrystalline silicon semiconductor layer.

7. The method for manufacturing the LTPS TFT substrate as claimed in claim 1, wherein in step (7), the gate insulation layer is formed of a material of SiOx.

8. A method for manufacturing a low-temperature polycrystalline silicon (LTPS) thin-film transistor (TFT) substrate, comprising the following steps:
   (1) providing a substrate and depositing a buffer layer on the substrate;
   (2) depositing a thermally conductive electrical insulation film on the buffer layer and patterning the thermally conductive electrical insulation film to form a thermally conductive electrical insulation layer;
   (3) depositing an amorphous silicon layer on the buffer layer in such a way that the amorphous silicon layer completely covers the thermally conductive electrical insulation layer;
   (4) implanting boron ions in the amorphous silicon layer through ion implantation; subjecting the amorphous silicon layer to rapid thermal annealing to have the amorphous silicon crystallized into polycrystalline silicon, and then applying an etching operation to remove an electrically conductive layer precipitating on a surface of the polycrystalline silicon during crystallization to form a polycrystalline silicon layer;
   (5) patterning the polycrystalline silicon layer to form a polycrystalline silicon semiconductor layer;
   (6) coating photoresist on the polycrystalline silicon semiconductor layer and conducting exposure and development on the photoresist to form a photoresist layer on the polycrystalline silicon semiconductor layer in such a way that two end portions of the polycrystalline silicon semiconductor layer are exposed; implanting boron ions into the two end portions of the polycrystalline silicon semiconductor layer through ion implantation with the photoresist layer serving as a shielding layer so as to form source/drain contact zones; and
   (7) peeling off the photoresist layer and forming, in sequence, a gate insulation layer, a gate terminal, an interlayer insulation layer, and source/drain terminals on the polycrystalline silicon semiconductor layer, wherein the source/drain terminals are respectively connected to the source/drain contact zones at the two end portions of the polycrystalline silicon semiconductor layer;
   wherein in step (1), the buffer layer is formed of a material of SiNx, SiOx, or a combination thereof;
   wherein in step (2), photolithographic and etching operations are applied to pattern the thermally conductive electrical insulation layer; the thermally conductive electrical insulation layer is formed of a material of $Al_2O_3$; and the thermally conductive electrical insulation layer has a thickness of 30-50 nm;
   wherein in step (3), the amorphous silicon layer has a thickness of 200-300 nm.

9. The method for manufacturing the LTPS TFT substrate as claimed in claim 8, wherein in step (4), the rapid thermal annealing is conducted at a temperature of 650° C.-700° C. for a time period of 15-25 minutes; and the electrically conductive layer that precipitates on the surface of the polycrystalline silicon is removed through etching by a thickness of 100-150 nm.

10. The method for manufacturing the LTPS TFT substrate as claimed in claim 8, wherein in step (5), photolithographic and etching operations are applied to pattern the polycrystalline silicon layer; and the pattern of the thermally conductive electrical insulation layer corresponds to the pattern of the polycrystalline silicon semiconductor layer.

11. The method for manufacturing the LTPS TFT substrate as claimed in claim 8, wherein in step (7), the gate insulation layer is formed of a material of SiOx.

12. A low-temperature polycrystalline silicon (LTPS) thin-film transistor (TFT) substrate, comprising a substrate, a buffer layer arranged on the substrate, a thermally conductive electrical insulation layer arranged on the buffer layer, a polycrystalline silicon semiconductor layer arranged on the thermally conductive electrical insulation layer, a gate insulation layer arranged on the buffer layer and covering the thermally conductive electrical insulation layer and the polycrystalline silicon semiconductor layer, a gate terminal arranged on the gate insulation layer, an interlayer insulation layer arranged on the gate insulation layer and covering the gate terminal, and source/drain terminals arranged on the interlayer insulation layer;
   wherein the polycrystalline silicon semiconductor layer has two opposite end portions that are source/drain contact zones implanted with boron ions; the gate insulation layer and the interlayer insulation layer both have portions corresponding to the source/drain contact zones and formed with vias; and the source/drain terminals are respectively connected through the vias to the source/drain contact zones.

13. The LTPS TFT substrate as claimed in claim 12, wherein the buffer layer is formed of a material of SiNx, SiOx, or a combination thereof; the thermally conductive electrical insulation layer is formed of a material of $Al_2O_3$; and the gate insulation layer is formed of a material of SiOx.

14. The LTPS TFT substrate as claimed in claim 12, wherein the thermally conductive electrical insulation layer has a thickness of 30-50 nm; the thermally conductive electrical insulation layer has a pattern corresponding to a pattern of the polycrystalline silicon semiconductor layer.

* * * * *